United States Patent
Lee et al.

(10) Patent No.: US 12,119,795 B2
(45) Date of Patent: Oct. 15, 2024

(54) AMPLIFIER CIRCUIT AND DISPLAY APPARATUS HAVING THE SAME

(71) Applicant: LG Display Co., Ltd., Seoul (KR)

(72) Inventors: HongJu Lee, Paju-si (KR); Hyunwoo Kim, Paju-si (KR); Beom-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/501,389

(22) Filed: Nov. 3, 2023

(65) Prior Publication Data

US 2024/0258977 A1    Aug. 1, 2024

(30) Foreign Application Priority Data

Jan. 30, 2023 (KR) .......................... 10-2023-0011841

(51) Int. Cl.
*G09G 3/3275* (2016.01)
*H03F 3/21* (2006.01)

(52) U.S. Cl.
CPC ........... *H03F 3/211* (2013.01); *G09G 3/3275* (2013.01); *G09G 2310/0291* (2013.01); *G09G 2320/0252* (2013.01); *G09G 2330/021* (2013.01); *H03F 2200/366* (2013.01); *H03F 2200/87* (2013.01)

(58) Field of Classification Search
CPC ............... H03F 2200/366; H03F 3/211; G09G 2330/021; G09G 2320/0252; G09G 2310/0291; G09G 3/3275
See application file for complete search history.

(56) References Cited

U.S. PATENT DOCUMENTS

| | | | |
|---|---|---|---|
| 7,646,226 B2 | 1/2010 | Kim | |
| 2006/0033576 A1* | 2/2006 | Luo | H03F 1/0261 330/296 |
| 2008/0048741 A1 | 2/2008 | Kim | |
| 2012/0249242 A1* | 10/2012 | Goldfarb | H03F 3/3028 330/252 |
| 2016/0240155 A1* | 8/2016 | Yang | G09G 3/3685 |

FOREIGN PATENT DOCUMENTS

| | | |
|---|---|---|
| KR | 10-0843200 B1 | 7/2008 |
| KR | 10-2369366 B1 | 3/2022 |

* cited by examiner

*Primary Examiner* — Abbas I Abdulselam
(74) *Attorney, Agent, or Firm* — Fenwick & West LLP

(57) ABSTRACT

Disclosed is an amplifier circuit comprising a first stage having first and second input terminals, a second stage configured to amplify a voltage supplied from the first stage and including a pull-up node and a pull-down node, a third stage including an output terminal, a tenth PMOS transistor, and a tenth NMOS transistors having gate electrodes respectively connected to the pull-up node and the pull-down node of the second stage, the third stage configured to perform a pull-up driving and pull-down driving of the amplified voltage, a first boosting circuit including an eleventh PMOS transistor having a gate electrode connected to the pull-up node and the first boosting circuit configured to increase a current in the first stage, and a second boosting circuit including an eleventh NMOS transistor having a gate electrode connected to the pull-down node and configured to increase the current in the first stage.

21 Claims, 10 Drawing Sheets

AMPLIFIER CIRCUIT AND DISPLAY APPARATUS HAVING THE SAME

CROSS-REFERENCE TO RELATED APPLICATION

This application claims priority to Republic of Korea Patent Application No. 10-2023-0011841 filed on Jan. 30, 2023, which is incorporated by reference in its entirety.

BACKGROUND

Technical Field

The present disclosure relates to an amplifier circuit and a display apparatus having the same.

Description of the Related Art

Demand for a display apparatus for displaying an image is increasing in various forms according to a development of an information society. Particularly, there is an increasing need for a display apparatus used in a portable small electronic device.

Among the display apparatuses, an electroluminescent display apparatus is a self-luminous type and has advantages of an excellent viewing angle, a good contrast ratio, and the like, compared to a liquid crystal display (LCD) apparatus. In addition, the electroluminescent display apparatus does not require a separate backlight so that it enables a light-weight thin type and has an advantageous effect of power consumption. Also, the electroluminescent display apparatus may be driven with a direction current (DC) low voltage and may have advantages of rapid response speed and low manufacturing cost. In addition, the electroluminescent display apparatus may include a display device such as an organic light emitting diode display OLED and a quantum dot light emitting display QLED.

On the other hand, a high-resolution small organic light emitting display device may be used in a portable electronic device. The high-resolution small organic light emitting display device may be an organic light emitting diode on silicon (OLEDoS) display formed by using a wafer-based semiconductor process. Also, research has been conducted to minimize a driving time of each pixel formed in the display device.

SUMMARY

The present disclosure has been made in view of the above problems, and it is an object of the present disclosure to provide a data driver including an amplifier circuit capable of minimizing or at least reducing a driving time and a display apparatus having the same.

In one embodiment, an amplifier circuit comprises: a first stage including a first input terminal and a second input terminal, the first stage configured to supply a voltage; a second stage connected to the first stage and configured to amplify the voltage supplied from the first stage, the second stage including a pull-up node and a pull-down node; a third stage including an output terminal, a tenth PMOS transistor having a gate electrode connected to the pull-up node of the second stage, and a tenth NMOS transistor having a gate electrode connected to the pull-down node of the second stage, the third stage configured to perform a pull-up driving of the amplified voltage supplied from the second stage or a pull-down driving of the amplified voltage supplied from the second stage; a first boosting circuit including an eleventh PMOS transistor having a gate electrode connected to the pull-up node included the second stage and the gate electrode of the tenth PMOS transistor included in the third stage, the first boosting circuit configured to increase a current in the first stage while the eleventh PMOS transistor is turned on; and a second boosting circuit including an eleventh NMOS transistor having a gate electrode connected to the pull-down node included the second stage and the gate electrode of the tenth NMOS transistor included in the third stage, the second boosting circuit configured to increase the current in the first stage while the eleventh NMOS transistor is turned on.

In one embodiment, a display apparatus comprises: a display panel including a plurality of pixels, a plurality of gate lines connected to the plurality of pixels, and a plurality of data lines connected to the plurality of pixels; a gate driver configured to drive the plurality of gate lines of the display panel; and a data driver configured to drive the plurality of data lines of the display panel, the data driver including an amplifier circuit that amplifies a data voltage, the amplifier circuit including: a first stage including a first input terminal and a second input terminal, the first input terminal connected to an output terminal of the amplifier circuit that outputs the data voltage; a second stage connected to the first stage and configured to amplify the data voltage, the second stage including a pull-up node and a pull-down node; and a third stage including the output terminal of the amplifier circuit that is connected to the first input terminal of the first stage, a pull-up PMOS transistor having a gate electrode connected to the pull-up node of the second stage, a pull-down NMOS transistor having a gate electrode connected to the pull-down node of the second stage, the third stage configured to perform a pull-up driving of the amplified data voltage supplied from the second stage while the pull-up PMOS transistor is turned on or a pull-down driving of the amplified data voltage supplied from the second stage while the pull-down NMOS transistor is turned on; a first boosting circuit including a first boosting PMOS transistor having a gate electrode connected to the pull-up node included in the second stage and the gate electrode of the pull-up PMOS transistor included in the third stage, the first boosting circuit configured to increase a current in the first stage while the first boosting PMOS transistor is turned on; and a second boosting circuit including a first boosting NMOS transistor having a gate electrode connected to the pull-down node included the second stage and the gate electrode of the pull-down NMOS transistor included in the third stage, the second boosting circuit configured to increase the current in the first stage while the first boosting NMOS transistor is turned on.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
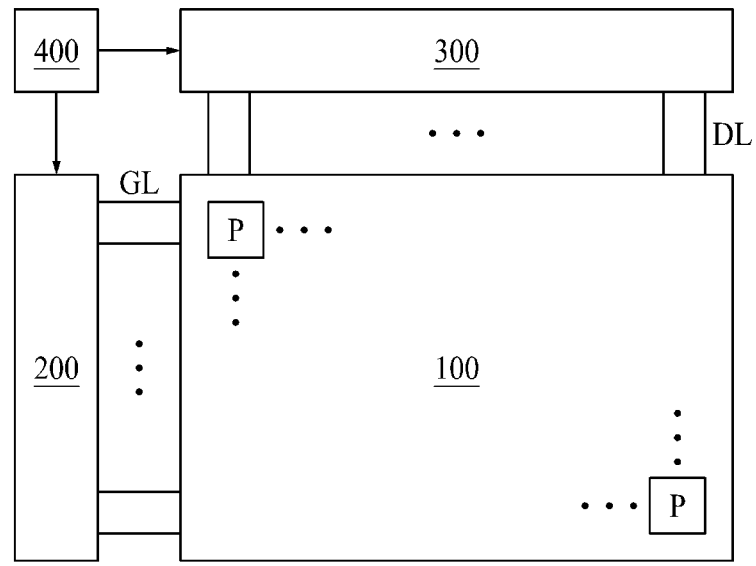
FIG. 1 is a block diagram illustrating a display apparatus according to first to third embodiments of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Hereinafter, embodiments of the present disclosure will be described in detail with reference to the accompanying drawings.

FIG. 1 is a block diagram illustrating a display apparatus according to first to third embodiments of the present disclosure.

Referring to FIG. 1, a light emitting display apparatus according to one embodiment of the present disclosure may include a display panel 100, a gate driver 200, a data driver 300, and a timing controller 400.

The light emitting display apparatus may be applied to various electronic devices such as a smart phone, a tablet, a smart pad, a television TV, a monitor, and the like. In particular, the light emitting display apparatus may be applied to a portable small electronic device.

The display panel 100 may be a flat panel display panel or a flexible display panel. A substrate of the display panel 100 may be formed of glass, plastic, or a plastic film, but is not limited thereto.

The display panel 100 may include a pixel array with a plurality of pixels P arranged in a matrix configuration. Each of the plurality of pixels P may include a plurality of subpixels individually including a light emitting element. Each pixel includes three subpixels, four subpixels, or two subpixels among a red subpixel for emitting red light, a green subpixel for emitting green light, a blue subpixel for emitting blue light, and a white subpixel for emitting white light.

Each of the plurality of pixels P is connected to a plurality of signal wirings including a gate line driven by the gate driver 200, a data line driven by the data driver 300, a power line for supplying a power voltage, and the like, and may be independently driven by each pixel circuit.

The light emitting element provided in each of the plurality of pixels P may be an organic light emitting diode OLED, a quantum dot light emitting diode LED, or an inorganic light emitting diode LED, but not limited thereto.

The gate driver 200 receives a plurality of gate control signals from the timing controller 400 and performs a shift operation to individually drive the gate lines GL of the display panel 100.

The data driver 300 is controlled according to a data control signal supplied from the timing controller 400, converts digital data supplied from the timing controller 400 into an analog data signal by using gamma voltages, and supplies the corresponding data signal to each of the data lines DL of the display panel 100.

The timing controller 400 rearranges digital video data inputted from the outside and supplies the rearranged digital video data to the data driver 300. The timing controller 400 may control operation timings of the gate driver 200 and the data driver 300 by using timing signals such as a vertical synchronization signal, a horizontal synchronization signal, and a data enable signal inputted from the outside.

Figure 2:
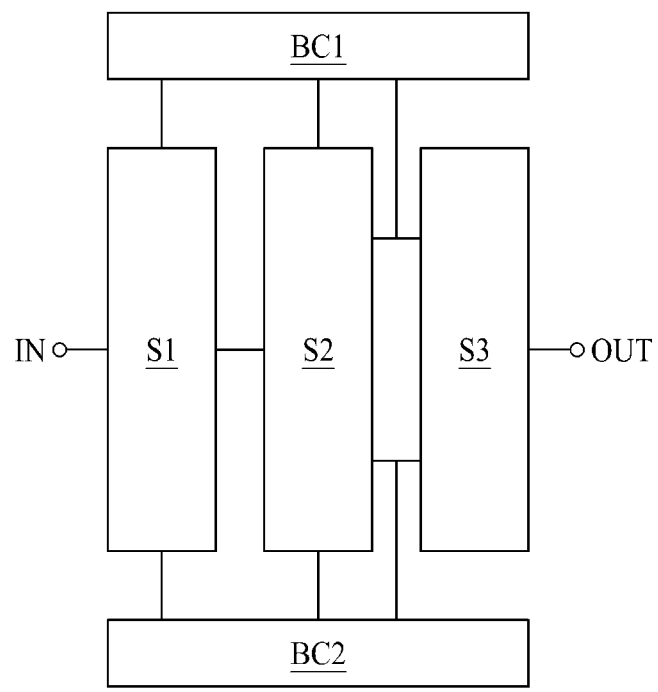
FIG. 2 is a block diagram illustrating an amplifier circuit of a data driver according to first to third embodiments of the present disclosure.

FIG. 2 is a block diagram illustrating an amplifier circuit of the data driver 300 according to first to third embodiments of the present disclosure.

The amplifier circuit may include a first stage S1, a second stage S2, a third stage S3, a first boosting circuit BC1, and a second boosting circuit BC2. The amplifier circuit may output a voltage having the same magnitude as that of a voltage supplied from an input terminal IN to an output terminal OUT. That is, the amplifier circuit may be driven as a unity gain buffer. In one embodiment, the amplifier circuit amplifies the data signals prior to supplying the data signals to the data lines DL.

The first stage S1 may be driven as an input stage. The first stage S1 receives a voltage from the input terminal IN and compares the voltage of the input terminal IN with the voltage of the output terminal OUT. The received voltage may be a data signal, for example.

The second stage S2 may be driven as a gain stage. Since an output error and a gain are inversely proportional, the second stage S2 may increase the gain in order to reduce the output error of the data driver 300.

The third stage S3 may be driven as a buffer stage. The third stage S3 may pull-up or pull-down the voltage. Specifically, when the voltage at the present output terminal OUT is less than the voltage of the input terminal IN, the third stage S3 may perform a pull-up function for increasing the voltage of the output terminal OUT by charging a current. Also, when the voltage at the present output terminal OUT is higher than the voltage of the input terminal IN, the third stage S3 may perform a pull-down function for reducing the voltage of the output terminal OUT by discharging the current.

The first and second boosting circuits BC1 and BC2 pull-up or pull-down the current, thereby increasing the current flowing in the input terminal IN.

First Embodiment

Figure 3:
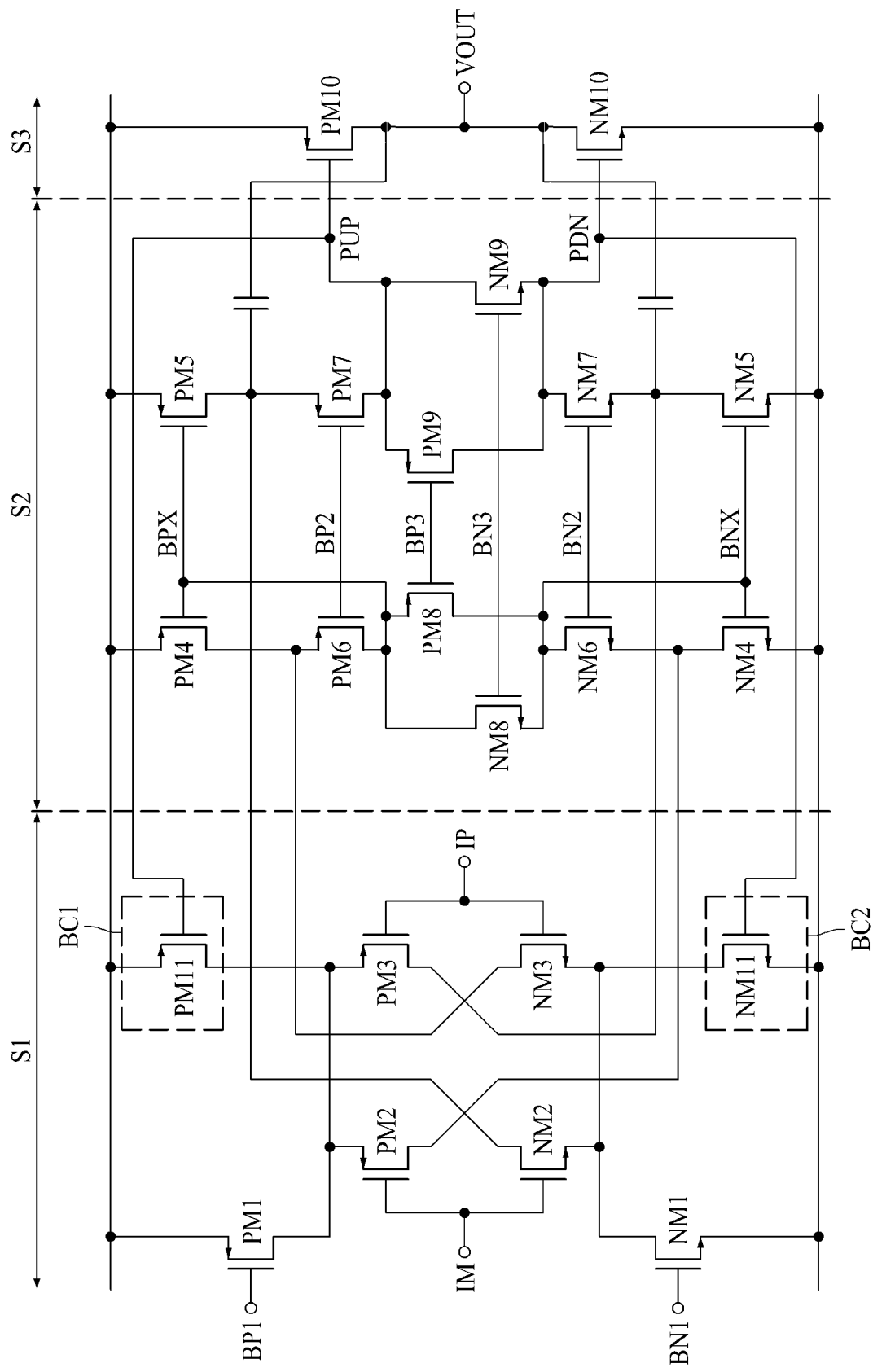
FIG. 3 is a circuit diagram of the amplifier circuit according to the first embodiment of the present disclosure.

FIG. 3 is a circuit diagram of an amplifier circuit according to the first embodiment of the present disclosure.

As described above, the amplifier circuit may include first to third stages S1 to S3 and first and second boosting circuits BC1 and BC2. In one embodiment, the first and second boosting circuits BC1 are included in the first stage as shown in FIG. 3.

The first stage S1 may include first to third PMOS transistors PM1, PM2, and PM3 and first to third NMOS transistors NM1, NM2, and NM3.

A gate electrode of the first PMOS transistor PM1 is connected to the bias terminal BP1 and the gate electrode of the first NMOS transistor NM1 may be connected to the bias terminal BN1. That is, the first PMOS transistor PM1 and the NMOS transistor NM1 may function as a DC source which receives a DC voltage from the bias terminals BP1 and BN1 and supplies a current having a predetermined magnitude. Accordingly, the second and third PMOS transistors PM2 and PM3 connected to a drain electrode of the first PMOS transistor PM1 may be driven in a saturation state. In the same manner, the second and third NMOS transistors NM2 and NM3 connected to a drain electrode of the first NMOS transistor NM1 may be driven in a saturation state.

A gate electrode for each of the second PMOS transistor PM2 and the NMOS transistor NM2 is connected to a first input terminal IM, and the first input terminal IM is electrically connected to an output terminal VOUT.

A gate electrode for each of the third PMOS transistor PM3 and the NMOS transistor NM3 may be connected to a second input terminal IP, and a pulse voltage may be supplied to the second input terminal IP.

When the voltage is supplied to the second input terminal IP, the first input terminal IM may have a voltage having the same magnitude as that of the voltage supplied to the second input terminal IP by a virtual ground effect. As described above, since the first input terminal IM is electrically connected to the output terminal VOUT, the output terminal VOUT may also output the voltage having the same magnitude as that of the voltage supplied to the second input terminal IP. Accordingly, the amplifier circuit may be driven as a unity gain buffer.

The second stage S2 may include fourth to ninth PMOS transistors PM4 to PM9 and fourth to ninth NMOS transistors NM4 to NM9.

Respective gate electrodes of the fourth and fifth PMOS transistors PM4 and PM5 and the fourth and fifth NMOS transistors NM4 and NM5 may respectively be supplied with voltages flowing through PMOS and NMOS feedback nodes BPX and BNX. That is, the fourth and fifth PMOS transistors PM4 and PM5 and the fourth and fifth NMOS transistors NM4 and NM5 may be supplied with voltages changed by feedback in the second stage S2. Accordingly, an amplification rate of the second stage S2 may be improved.

Respective gate electrodes of the sixth to ninth PMOS transistors PM6 to PM9 and the sixth to ninth NMOS transistor NM6 to NM9 may be respectively connected to bias terminals BP2, BP3, BN2, and BN3. That is, the sixth to ninth PMOS transistor PM6 to PM9 and the sixth to ninth NMOS transistor NM4 to NM9 may receive the DC voltage, may amplify the voltage provided from the first stage S1, and may transfer the amplified voltage to the third stage S3.

The third stage S3 includes tenth PMOS and NMOS transistors PM10 and NM10, and the third stage S3 may stably maintain an amplification rate of the second stage S2.

The gate electrode for each of the tenth PMOS transistor PM10 and the tenth NMOS transistor NM10 is connected to the second stage S2, and a drain electrode for each of the tenth PMOS transistor PM10 and the tenth NMOS transistor NM10 is connected to the output terminal VOUT.

The first boosting circuit BC1 may include an eleventh PMOS transistor PM11 (e.g., a first boosting PMOS transistor).

A gate electrode of the eleventh PMOS transistor PM11 may be connected to a pull-up node PUP in the second stage S2, and a drain electrode of the eleventh PMOS transistor PM11 may be connected to source electrodes of the second and third PMOS transistors PM2 and PM3.

The second boosting circuit BC2 may include an eleventh NMOS transistor NM11 (e.g., a first boosting NMOS transistor).

A gate electrode of the eleventh NMOS transistor NM11 may be connected to a pull-down node PDN in the second stage S2, and a drain electrode of the eleventh NMOS transistor NM11 may be connected to source electrodes of the second and third NMOS transistors NM2 and NM3.

Figure 4:
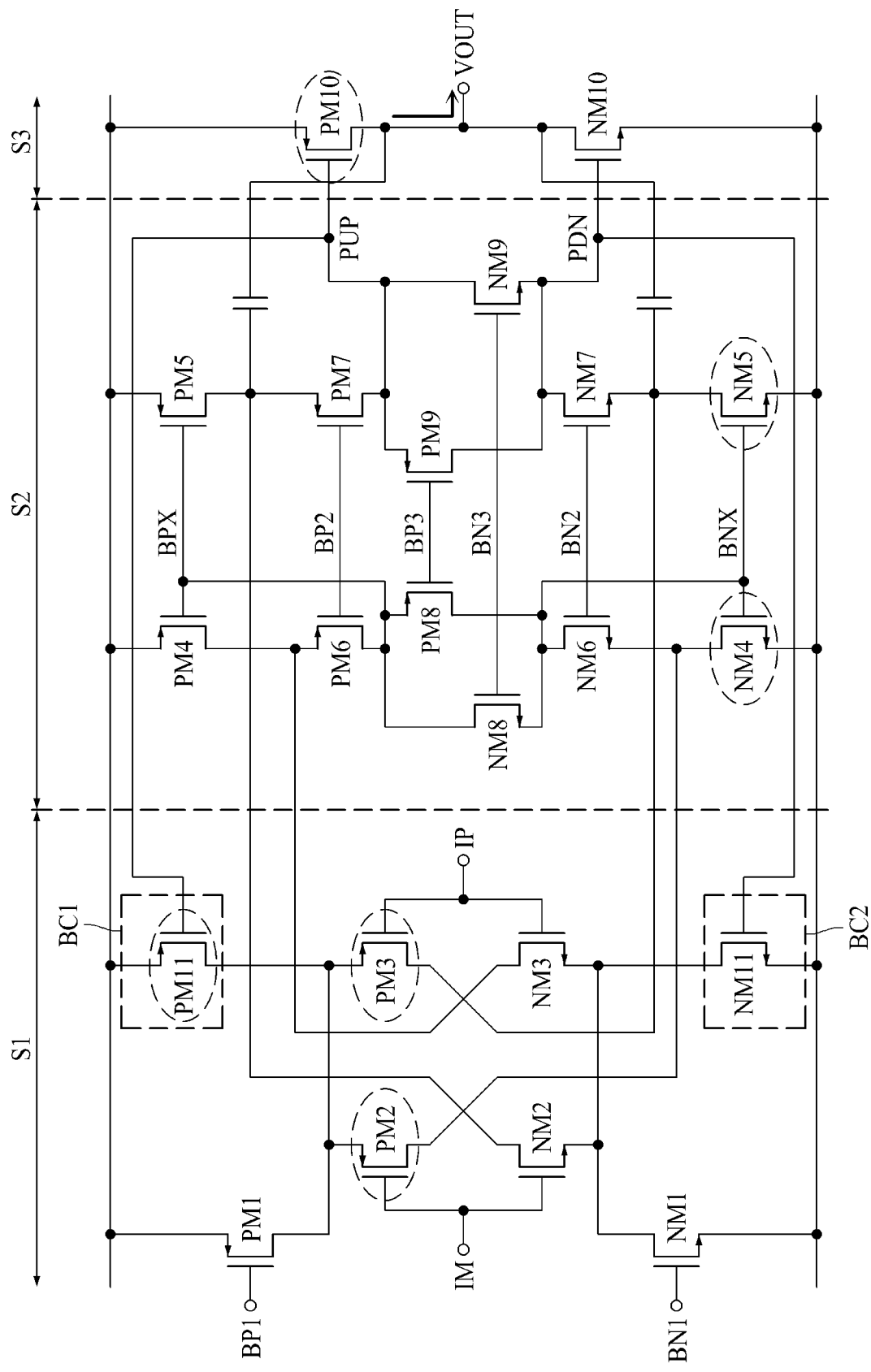
FIG. 4 is a circuit diagram illustrating driving of a rising period of the amplifier circuit according to the first embodiment of the present disclosure.

FIG. 4 is a circuit diagram illustrating driving of a rising period of the amplifier circuit according to the first embodiment of the present disclosure. In one embodiment, transistors that are enclosed by a dashed ellipse are turned on.

In the rising period, the magnitude of the current discharged to the output terminal VOUT may be increased. That is, in order to increase the magnitude of the current flowing from the inside of the circuit to the output terminal VOUT, the voltage of the pull-up node PUP may be reduced.

Since the voltage of the pull-up node PUP is reduced, the magnitude of the current flowing through the tenth and eleventh PMOS transistors PM10 and PM11 (e.g., turned on) to which the pull-up node PUP and the gate electrode are connected may be increased. Also, the current flowing through the eleventh PMOS transistor PM11 may flow to the fourth and fifth NMOS transistors NM4 and NM5 (e.g., turned on) through the second and third PMOS transistors PM2 and PM3 (e.g., turned on) and may be discharged to the ground.

In this case, the current increased in the eleventh PMOS transistor PM11 flows through the second and third PMOS transistors PM2 and PM3 that are turned on, whereby the magnitude of the current flowing through the first and second input terminals IM and IP may be instantaneously increased.

As described above, the gate electrodes of the first PMOS transistor PM1 and the first NMOS transistor NM1 are respectively connected to the bias terminals BP1 and BN1 so that the flow of the current is not changed in the rising period. Similarly, since the respective gate electrodes of the sixth to ninth PMOS transistors PM6 to PM9 and the sixth to ninth NMOS transistors NM4 to NM9 are connected to the bias terminals BP2, BP3, BN2, and BN3, the flow of the current is not changed in the rising period.

Figure 5:
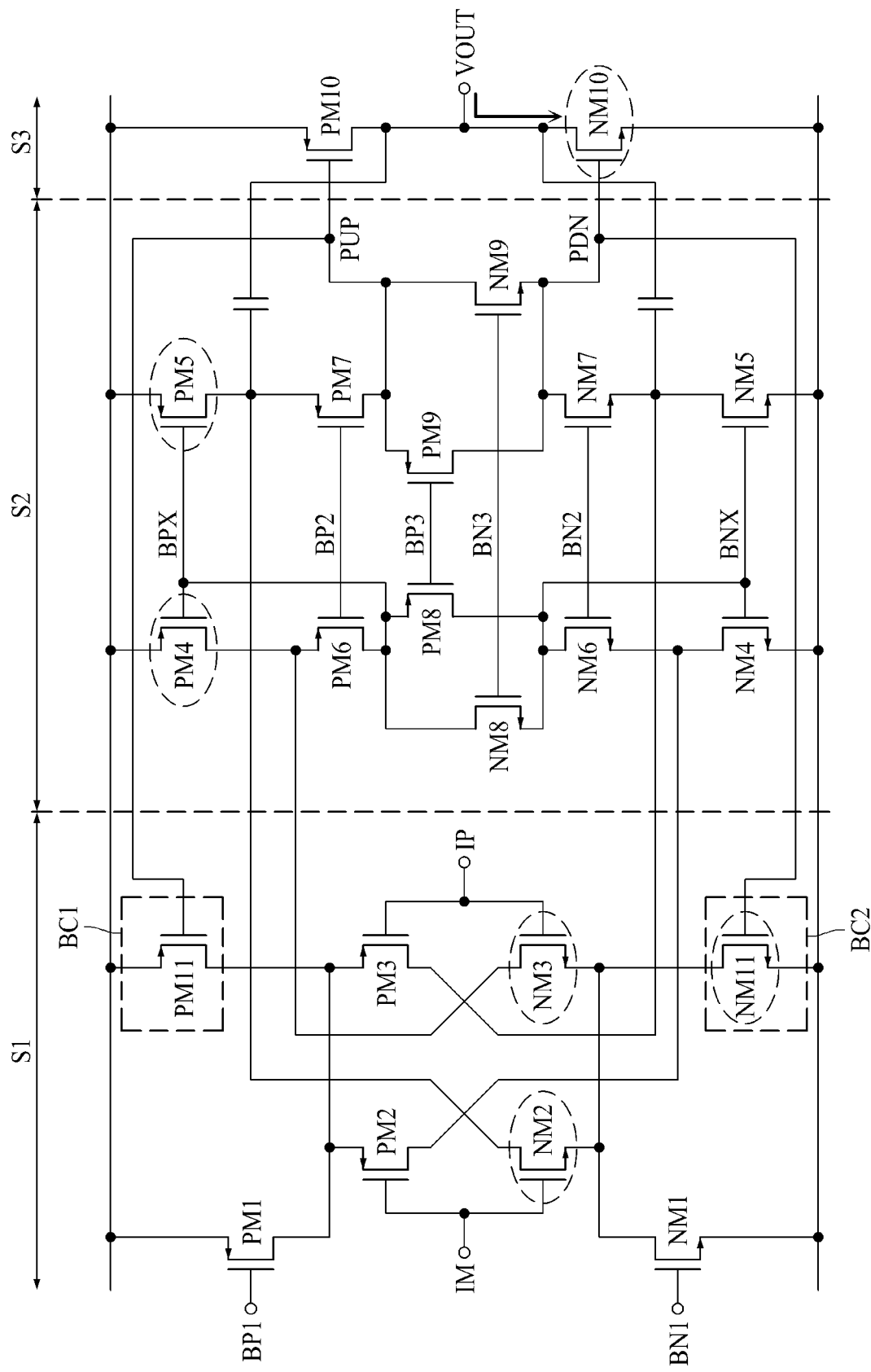
FIG. 5 is a circuit diagram illustrating driving of a falling period of the amplifier circuit according to the first embodiment of the present disclosure.

FIG. 5 is a circuit diagram illustrating driving of a falling period of the amplifier circuit according to the first embodiment of the present disclosure.

In the falling period, the magnitude of the current charged in the output terminal VOUT may be increased. That is, the voltage of the pull-down node PDN may be increased to increase the magnitude of the current flowing to the inside of the circuit from the output terminal VOUT.

Since the voltage of the pull-down node PDN is increased, the magnitude of the current flowing through the tenth and eleventh NMOS transistors NM10 and NM11 (e.g., turned on) connected to the pull-down node PDN and the gate electrode may be increased. Also, the current flowing through the fourth and fifth PMOS transistors PM4 and PM5 (e.g., turned on) may flow to the eleventh NMOS transistor NM11 (e.g., turned on) through the second and third NMOS transistors NM2 and NM3 (e.g., turned on) and may be discharged to the ground.

In this case, in order to increase the current flowing in the eleventh NMOS transistor NM11, the magnitude of the current flowing through the fourth and fifth PMOS transistors PM4 and PM5 and the second and third NMOS transistors NM2 and NM3 that are turned on may be also increased. That is, the magnitude of the current flowing in the second and third NMOS transistors NM2 and NM3 is increased, whereby the magnitude of the current flowing through the first and second input terminals IM and IP may be instantaneously increased.

Consequently, in the first embodiment of the present disclosure, the first boosting circuit BC1 including the eleventh PMOS transistor PM11 and the second boosting circuit BC2 including the eleventh NMOS transistor NM11 may be initiated, whereby the magnitude of the current flowing through the input terminal IM and IP may be increased in the rising and falling periods. In detail, the magnitude of the current flowing through the input terminal IM and IP of the PMOS transistor may be increased through the first boosting circuit BC1 for the rising period, and the magnitude of the current flowing through the input terminal IM and IP of the NMOS transistor is increased through the second boosting circuit BC2 for the falling period.

Accordingly, in the rising and falling periods, the voltage of the output terminal VOUT may be rapidly changed so that the voltage of the output terminal VOUT reaches the magnitude of the voltage of the second input terminal IP. Also, since the current flowing only during the rising and falling periods is instantaneously changed, it is possible to maintain the magnitude of static current. Accordingly, the magnitude of static current is maintained, and the driving time of pixel is minimized or at least reduced so that it is possible to reduce power consumption and thus to realize the low-power amplifier circuit.

Second Embodiment

Figure 6:
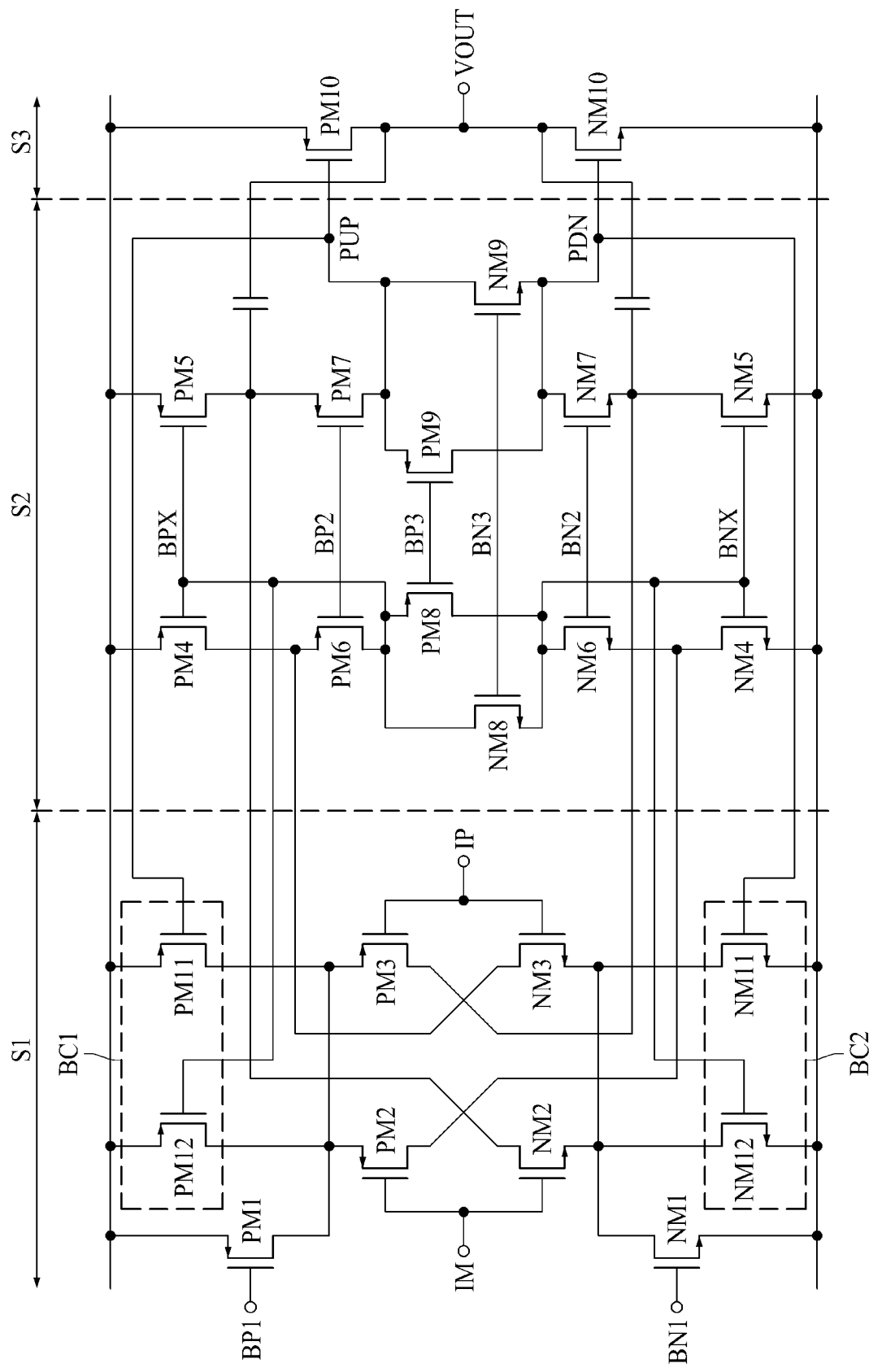
FIG. 6 is a circuit diagram of the amplifier circuit according to the second embodiment of the present disclosure.

FIG. 6 is a circuit diagram of an amplifier circuit according to the second embodiment of the present disclosure.

Except for first and second boosting circuits BC1 and BC2, the amplifier circuit according to FIG. 6 has substantially the same structure as the amplifier circuit according to FIG. 3. Therefore, the same elements as those of the amplifier circuit shown in FIG. 3 are denoted by the same reference numerals, and a repetitive description for the same parts will be omitted.

The first boosting circuit BC1 may further include a twelfth PMOS transistor PM12 (e.g., a second boosting PMOS transistor) in addition to the eleventh PMOS transistor PM11. In one embodiment, the first and second boosting circuits BC1 are included in the first stage S1 as shown in FIG. 6.

A gate electrode of the twelfth PMOS transistor PM12 may be connected to a PMOS feedback node BPX, and a drain electrode of the twelfth PMOS transistor PM12 may be connected to a source electrode of each of second and third PMOS transistors PM2 and PM3.

The second boosting circuit BC2 may further include a twelfth NMOS transistor NM12 (e.g., a second boosting NMOS transistor) in addition to the eleventh NMOS transistor NM11.

A gate electrode of the twelfth NMOS transistor NM12 may be connected to an NMOS feedback node BNX, and a drain electrode of the twelfth NMOS transistor NM12 may be connected to a source electrode of each of second and third NMOS transistors NM2 and NM3.

Figure 7:
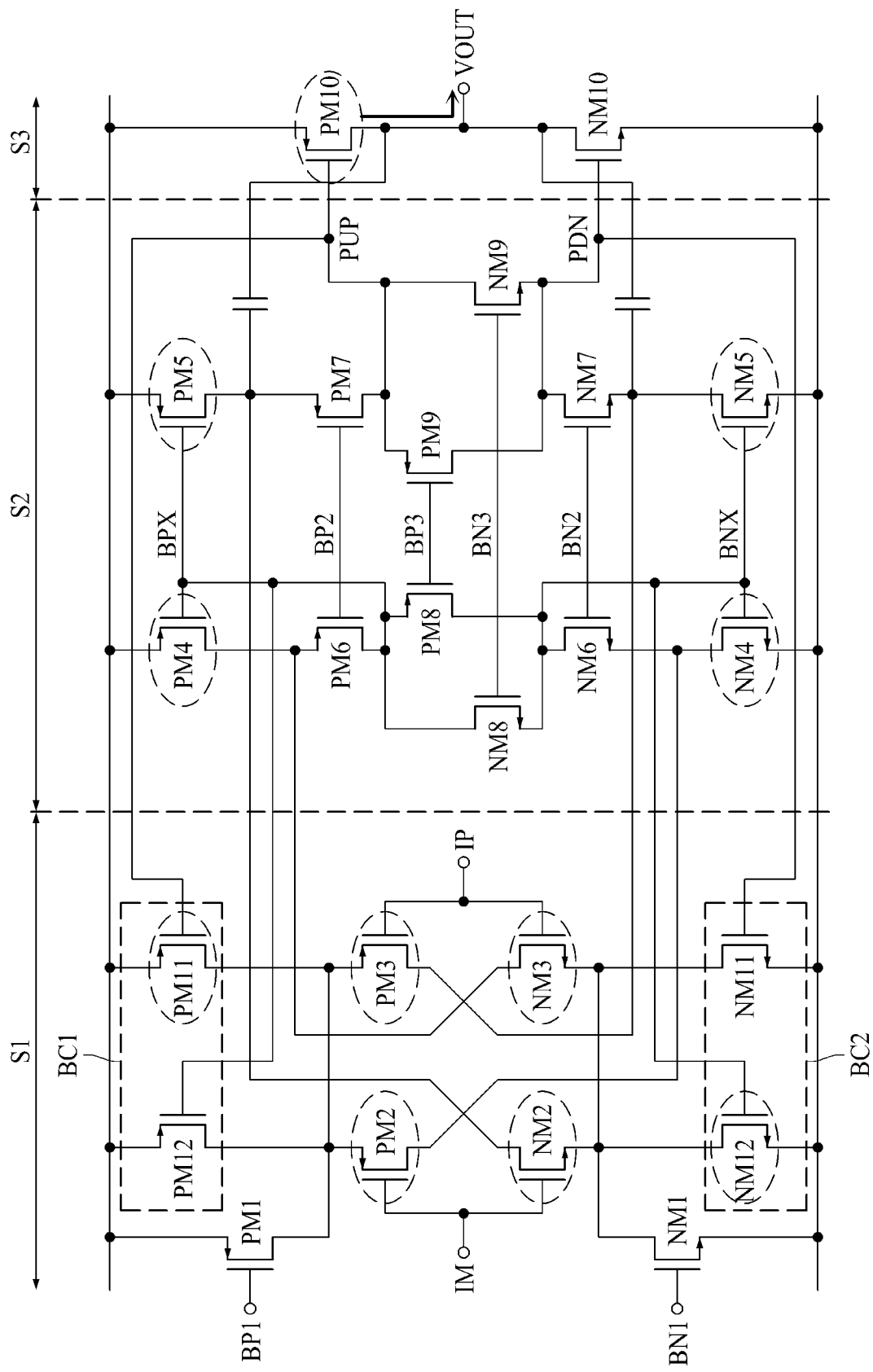
FIG. 7 is a circuit diagram illustrating driving of a rising period of the amplifier circuit according to the second embodiment of the present disclosure.

FIG. 7 is a circuit diagram illustrating driving of a rising period of the amplifier circuit according to the second embodiment of the present disclosure.

In the rising period, a magnitude of a current discharged to an output terminal VOUT may be increased. That is, in order to increase the magnitude of the current flowing from the inside of circuit to the output terminal VOUT, a voltage of a pull-up node PUP may be reduced.

According as the voltage of the pull-up node PUP is reduced, the magnitude of the current flowing through the tenth and eleventh PMOS transistors PM10 and PM11 (e.g., turned on) to which the pull-up node PUP and the gate electrode are connected may be increased. Also, the current flowing through the eleventh PMOS transistor PM11 may flow to the fourth and fifth NMOS transistors NM4 and NM5 (e.g., turned on) through the second and third PMOS transistors PM2 and PM3 (e.g., turned on) and may be discharged to the ground.

As the current increased in the eleventh PMOS transistor PM11 flows through the second and third PMOS transistors PM2 and PM3 that are turned on, the magnitude of the current flowing through first and second input terminals IM and IP may be increased.

Also, since the increased current should be discharged to the ground through the fourth and fifth NMOS transistors NM4 and NM5, the magnitude of voltage in the NMOS feedback node BNX connected to the gate electrodes of the fourth and fifth NMOS transistors NM4 and NM5 may be increased. Since the voltage of the NMOS feedback node BNX is increased, the magnitude of the current flowing through the twelfth NMOS transistor NM12 to which the NMOS feedback node BNX and the gate electrode are connected may be increased.

In order to increase the current flowing through the twelfth NMOS transistor NM12, the magnitude of the current flowing through the fourth and fifth PMOS transistors PM4 and PM5 and the second and third NMOS transistors NM2 and NM3 that are turned on may be increased. In this case, the magnitude of the current flowing through the first and second input terminals IM and IP connected to the second and third NMOS transistors NM2 and NM3 may be increased. Accordingly, the magnitude of the current flowing through the input terminals IM and IP of the PMOS transistor and the NMOS transistor may be increased in the rising period.

Figure 8:
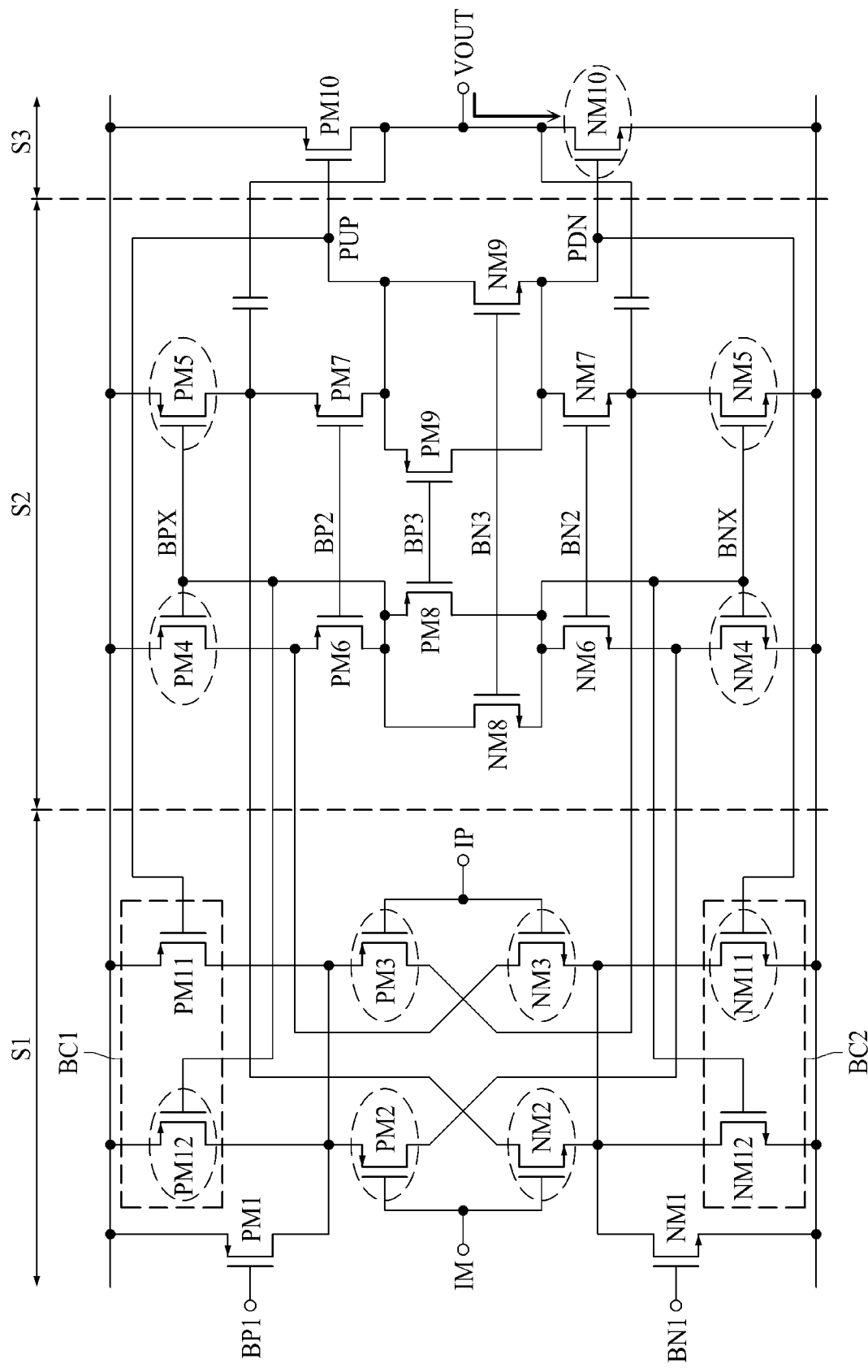
FIG. 8 is a circuit diagram illustrating driving of a falling period of the amplifier circuit according to the second embodiment of the present disclosure.

FIG. 8 is a circuit diagram illustrating driving of a falling period of the amplifier circuit according to the second embodiment of the present disclosure.

In the falling period, the magnitude of the current charged in the output terminal VOUT may be increased. That is, a voltage of a pull-down node PDN may be increased in order to increase the magnitude of the current flowing to the circuit from the output terminal VOUT.

Accordingly as the voltage of the pull-down node PDN is increased, the magnitude of the current flowing through the tenth and eleventh NMOS transistors NM10 and NM11 (e.g., turned on) connected to the pull-down node PDN and the gate electrode may be increased. Also, the current flowing through the fourth and fifth PMOS transistors PM4 and PM5 (e.g., turned on) may flow to the eleventh NMOS transistor NM11 through the second and third NMOS transistors NM2 and NM3 (e.g., turned on) and may be discharged to the ground.

In this case, the magnitude of the current flowing in the fourth and fifth PMOS transistors PM4 and PM5 and the second and third NMOS transistors NM2 and NM3 that are turned on may be increased to increase the current flowing in the eleventh NMOS transistor NM11. That is, the magnitude of the current flowing in the second and third NMOS transistors NM2 and NM3 increases, whereby the magnitude of the current flowing through the first and second input terminals IM and IP may be increased.

Also, since the magnitude of the current flowing through the fourth and fifth PMOS transistors PM4 to PM5 (e.g., turned on) should be increased, a magnitude of voltage in a PMOS feedback node BPX connected to the gate electrodes of the fourth and fifth PMOS transistors PM4 and PM5 may be reduced. According as the voltage of PMOS feedback node BPX is reduced, the magnitude of the current flowing through the twelfth PMOS transistor PM12 to which the PMOS feedback node BPX and the gate electrode are connected may be increased.

The current flowing through the twelfth PMOS transistor PM12 flows to the fourth and fifth NMOS transistors NM4 and NM5 (e.g., turned on) through the second and third PMOS transistors PM2 and PM3 (e.g., turned on) and may be discharged to the ground. In this case, as the current increased in the twelfth PMOS transistor PM12 flows through the second and third PMOS transistors PM2 and PM3 that are turned on, the magnitude of the current flowing through the first and second input terminals IM and IP may be increased.

Consequently, in the second embodiment of the present disclosure, the first boosting circuit BC1 including the eleventh and twelfth PMOS transistors PM11 and PM12 and the second boosting circuit BC2 including the eleventh and twelfth NMOS transistors NM11 and NNM12 are initiated, whereby the magnitude of the current flowing in the input terminals IM and IP may be instantaneously increased in the rising and falling periods.

In case of the first embodiment of the present disclosure, the magnitude of the current flowing through the input terminal IM and IP of the PMOS transistor is instantaneously increased in the rising period, and the magnitude of the current flowing through the input terminal IM and IP of the NMOS transistor is instantaneously increased in the falling period. Meanwhile, in case of the second embodiment of the present disclosure, the magnitude of the current flowing through the input terminal IM and IP of the PMOS transistor and the NMOS transistor may be instantaneously increased in each of the rising and falling periods. Accordingly, in comparison to the first embodiment of the present disclosure, the second embodiment of the present disclosure may realize more increased magnitude of the current flowing through the input terminal IM and IP. Accordingly, in case of the second embodiment of the present disclosure, the voltage of the output terminal VOUT may be changed more rapidly so that the voltage of the output terminal VOUT reaches the magnitude of the voltage of the second input terminal IP in the rising and falling period, as compared to the first embodiment of the present disclosure.

Third Embodiment

Figure 9:
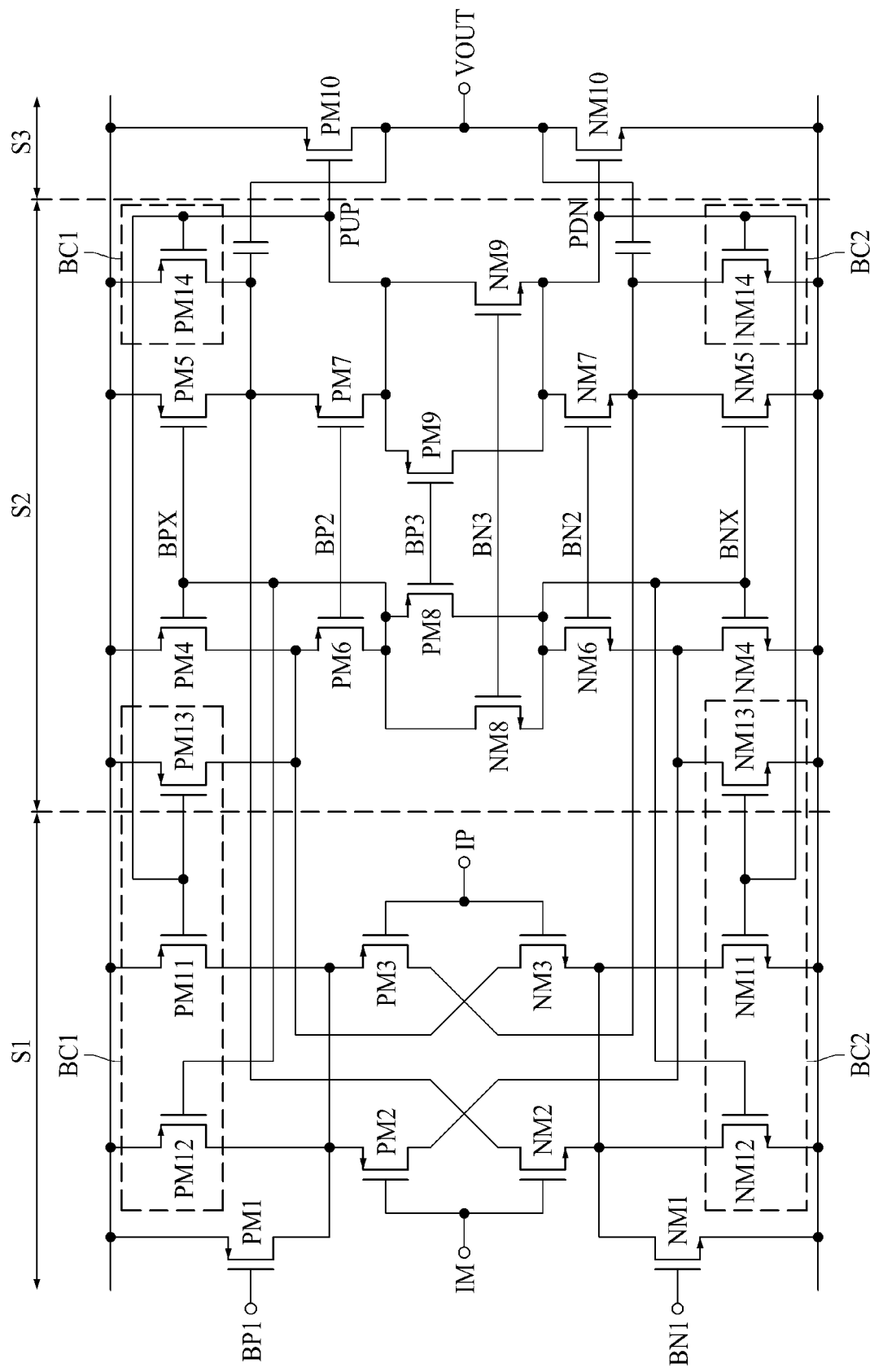
FIG. 9 is a circuit diagram of the amplifier circuit according to the third embodiment of the present disclosure.

FIG. 9 is a circuit diagram of an amplifier circuit according to the third embodiment of the present disclosure.

Except for first and second boosting circuits BC1 and BC2, the amplifier circuit according to FIG. 9 has substantially the same structure as the amplifier circuit according to FIG. 6. Therefore, the same elements as those of the amplifier circuit shown in FIG. 6 are denoted by the same reference numerals, and a repetitive description for the same parts will be omitted.

The first boosting circuit BC1 may further include thirteenth and fourteenth PMOS transistors PM13 and PM14 (e.g., third and fourth boosting PMOS transistors, respectively) in addition to the eleventh and twelfth PMOS transistors PM11 and PM12. In one embodiment, a first part of each of the first and second boosting circuits BC1 and BC2 are included in the first stage and a second part of each of the first and second boosting circuits BC1 and BC2 are included in the second stage S2 as shown in FIG. 9.

A gate electrode of the thirteenth PMOS transistor PM13 may be connected to a pull-up node PUP, and a drain electrode of the thirteenth PMOS transistor PM13 may be connected to a drain electrode of a third NMOS transistor NM3. A gate electrode of the fourteenth PMOS transistor PM14 may be connected to a pull-up node PUP, and a drain electrode of the fourteenth PMOS transistor PM14 may be connected to a drain electrode of a second NMOS transistor NM2.

The second boosting circuit BC2 may further include thirteenth and fourteenth NMOS transistor NM13 and NM14 (e.g., third and fourth boosting NMOS transistors, respectively) in addition to the eleventh and twelfth NMOS transistors NM11 and NM12.

A gate electrode of the thirteenth NMOS transistor NM13 may be connected to a pull-down node PDN, and a drain electrode of the thirteenth NMOS transistor NM13 may be connected to a drain electrode of a second PMOS transistor PM2. A gate electrode of the fourteenth NMOS transistor NM14 may be connected to the pull-down node PDN, and a drain electrode of the fourteenth NMOS transistor NM14 may be connected to a drain electrode of a third PMOS transistor PM3.

Figure 10:
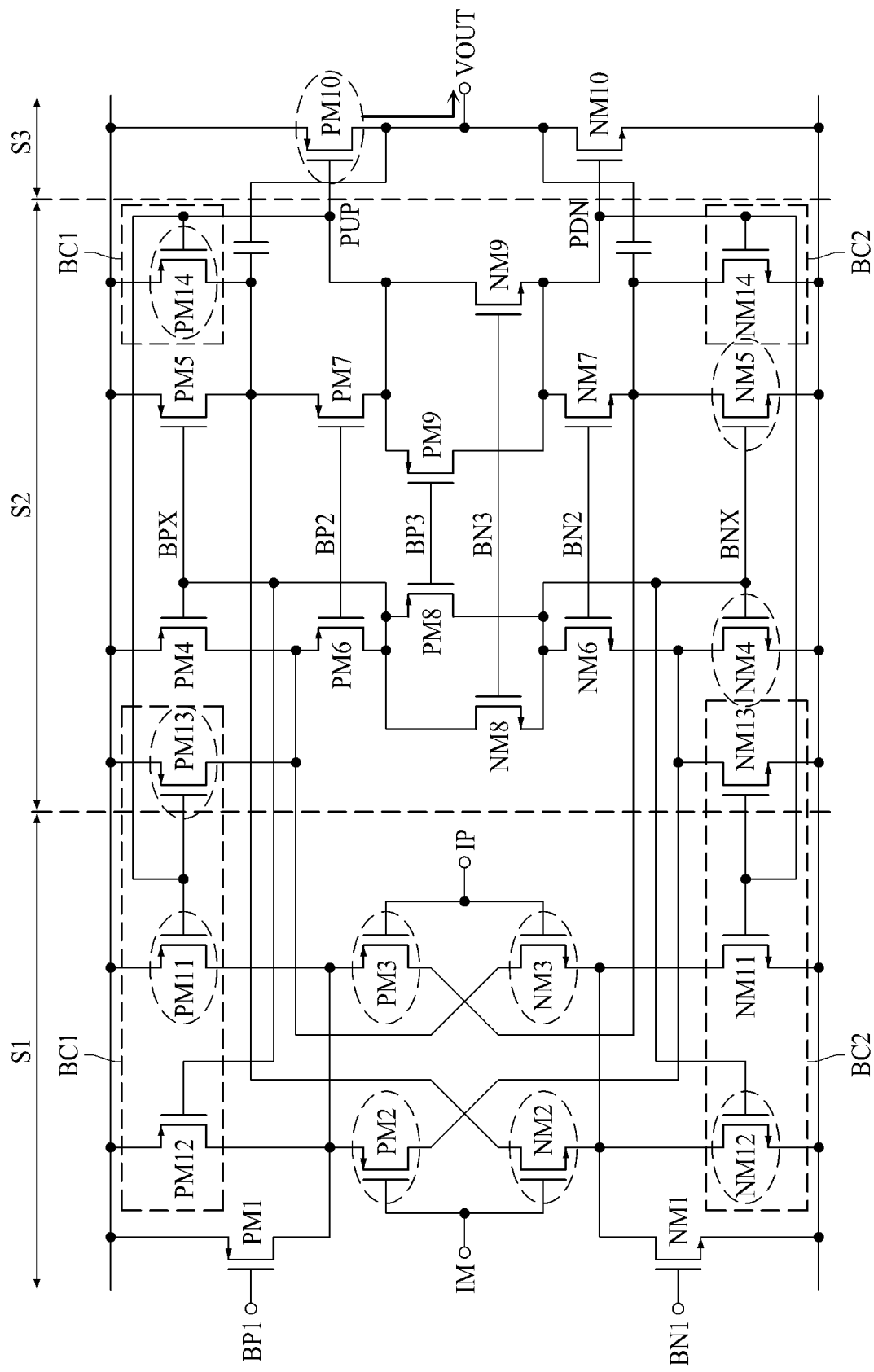
FIG. 10 is a circuit diagram illustrating driving of a rising period of the amplifier circuit according to the third embodiment of the present disclosure.

FIG. 10 is a circuit diagram illustrating driving of a rising period of the amplifier circuit according to the third embodiment of the present disclosure.

In the rising period, a magnitude of a current discharged to an output terminal VOUT may be increased. That is, a voltage of the pull-up node PUP may be reduced to increase the magnitude of the current flowing from the inside of the circuit to the output terminal VOUT.

As the voltage of the pull-up node PUP is reduced, a magnitude of a current flowing through the tenth, eleventh, thirteenth, and fourteenth PMOS transistors PM10, PM11, PM13, and PM14 to which the pull-up node and the gate electrode are connected may be increased.

The current flowing through the eleventh PMOS transistor PM11 (e.g., turned on) may flow to the fourth and fifth NMOS transistors NM4 and NM5 (e.g., turned on) through the second and third PMOS transistors PM2 and PM3 (e.g., turned on) and may be discharged to the ground.

Also, since the increased current should be emitted to the ground through the fourth and fifth NMOS transistors NM4 and NM5 (e.g., turned on), a magnitude of voltage in an NMOS feedback node BNX connected to the gate electrodes of the fourth and fifth NMOS transistors NM4 and NM5 may be increased. According as the voltage of NMOS feedback node BNX is increased, the magnitude of the current flowing through the twelfth NMOS transistor NM12 (e.g., turned on) to which the NMOS feedback node BNX and the gate electrode are connected may be increased.

In this case, the current increased in the thirteenth and fourteenth PMOS transistors PM13 and PM14 (e.g., turned on) may flow to the twelfth NMOS transistor NM12 (e.g., turned on) through the second and third NMOS transistors NM2 and NM3 (e.g., turned on) and may be discharged to the ground. Accordingly, the current increased in the thirteenth and fourteenth PMOS transistors PM13 and PM14 flows through the second and third NMOS transistors NM2 and NM3, so that the magnitude of the current flowing through the first and second input terminals IM and IP may be increased.

The current increased in the tenth, eleventh, thirteenth and fourteenth PMOS transistors PM10, PM11, PM13, and PM14 may flow to the input terminals IM and IP of both the PMOS and NMOS transistors.

Figure 11:
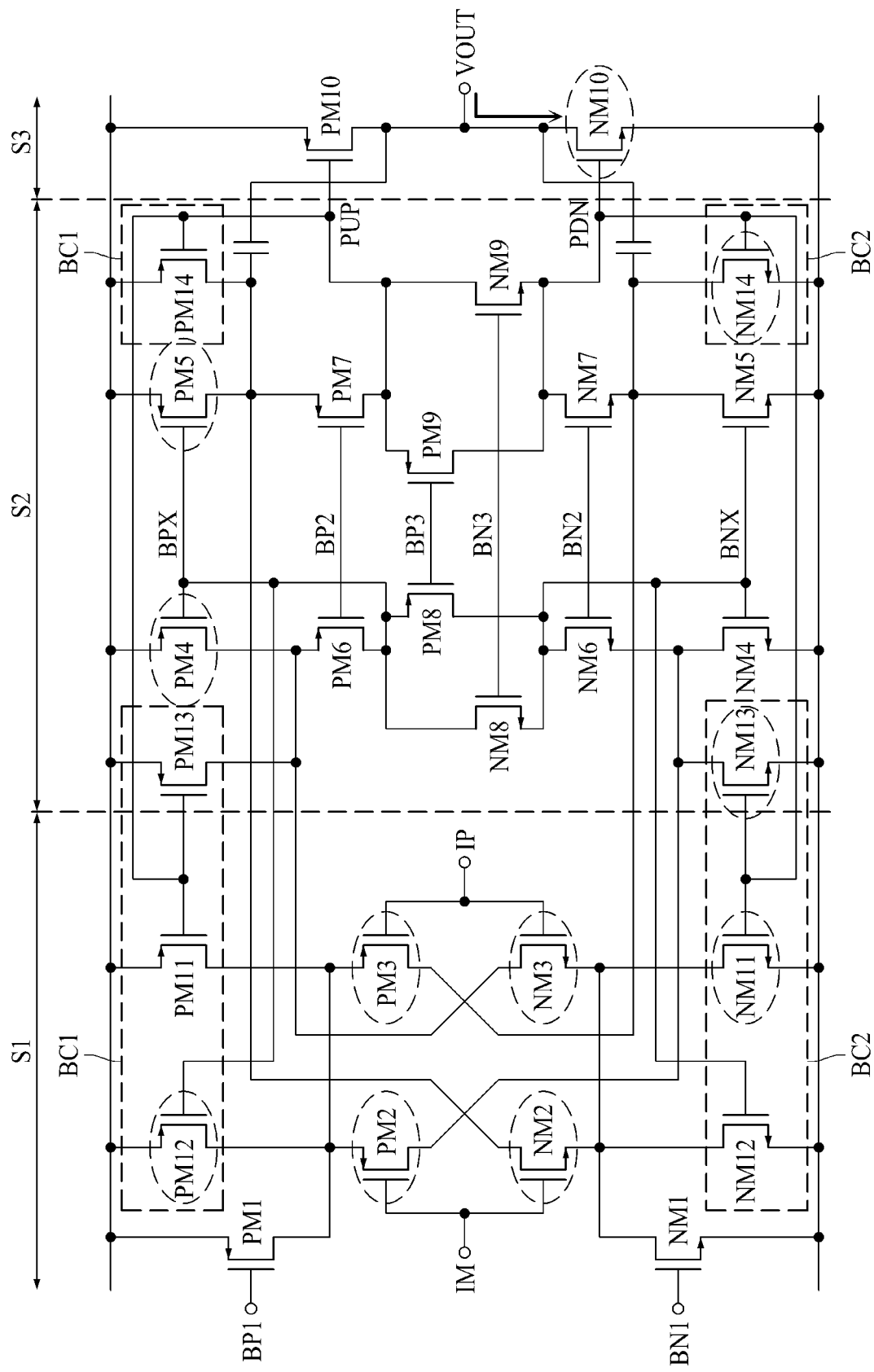
FIG. 11 is a circuit diagram illustrating driving of a falling period of the amplifier circuit according to the third embodiment of the present disclosure.

FIG. 11 is a circuit diagram illustrating driving of a falling period of the amplifier circuit according to the third embodiment of the present disclosure.

In the falling period, the magnitude of the current charged to the output terminal VOUT may be increased. That is, the voltage of pull-down node PDN may be increased to increase the magnitude of the current flowing to the inside of the circuit from the output terminal VOUT.

As the voltage of the pull-down node PDN is increased, the magnitude of the current flowing through the tenth, eleventh, thirteenth, and fourteenth NMOS transistors NM10, NM11, NM13, and NM14 connected to the pull-down node PDN and the gate electrode may be increased.

In order to increase the current flowing in the eleventh NMOS transistor NM11, the magnitude of the current flowing through the fourth and fifth PMOS transistors PM4 and PM5 (e.g., turned on) and the second and third NMOS transistors NM2 and NM3 (e.g., turned on) may be increased.

Also, since the magnitude of the current flowing through the fourth and fifth PMOS transistors PM4 and PM5 should be increased, the magnitude of the voltage of the PMOS feedback node BPX connected to the gate electrodes of the fourth and fifth PMOS transistors PM4 and PM5 may be reduced. According as the voltage of the PMOS feedback node BPX is reduced, the magnitude of the current flowing through the twelfth PMOS transistor PM12 to which the PMOS feedback node BPX and the gate electrode are connected may be increased.

The current increased in the twelfth PMOS transistor PM12 flows to the thirteenth and fourteenth NMOS transistors NM13 and NM14 (e.g., turned on) through the second and third PMOS transistors PM2 and PM3 (e.g., turned on) and may be discharged to the ground. Accordingly, the current increased in the twelfth PMOS transistor PM12 flows through the second and third PMOS transistors PM2 and PM3 (e.g., turned on), whereby the magnitude of the current flowing through the first and second input terminals IM and IP may be increased.

That is, the current increased in the tenth, eleventh, thirteenth, and fourteenth NMOS transistors NM10, NM11, NM13, and NM14 may flow to the input terminals IM and IP of both the PMOS transistor and the NMOS transistor.

Consequently, in the third embodiment of the present disclosure, the first boosting circuit BC1 including the eleventh to fourteenth PMOS transistors PM11 to PM14 and the second boosting circuit BC2 including the eleventh to fourteenth NMOS transistors PM11 to NM14 are initiated, whereby the magnitude of the current flowing in the input terminals IM and IP may be increased in the rising and falling periods. That is, in the same manner as the second embodiment of the present disclosure, the third embodiment of the present disclosure may increase the magnitude of the current flowing through the input terminals IM and IP of the PMOS transistor and the NMOS transistor in the rising and falling period.

Referring to FIGS. 7 and 8, in the second embodiment of the present disclosure, the fourth and fifth PMOS transistors PM4 and PM5 and the fourth and fifth NMOS transistors NM4 and NM5 are simultaneously driven in the rising and falling periods, so that all the voltages of the PMOS and NMOS feedback nodes BPX and BNX may be changed. In this case, if a large amount of the current flows in the tenth PMOS transistor PM10 and the tenth NMOS transistor NM10, the eighth PMOS transistor PM8 and the eighth NMOS transistor NM8 are turned-off, whereby the amplifier circuit may not be stably driven.

On the other hand, in the third embodiment of the present disclosure, only the fourth and fifth NMOS transistors NM4 and NM5 are driven in the rising period, whereby the voltage of the NMOS feedback node BNX may be changed. Meanwhile, only the fourth and fifth PMOS transistors PM4 and PM5 are driven in the falling period, whereby the voltage of the PMOS feedback node BPX may be changed. Accordingly, as compared to the amplifier circuit according to the second embodiment of the present disclosure, the amplifier circuit according to the third embodiment of the present disclosure may be more stably driven.

According to the present disclosure, the current boosting circuit is formed to maintain an operating current, minimize pixel driving time, and reduce power consumption, thereby implementing the low power driving amplifier circuit.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. An amplifier circuit comprising:
a first stage including a first input terminal and a second input terminal, the first stage configured to supply a voltage;
a second stage connected to the first stage and configured to amplify the voltage supplied from the first stage, the second stage including a pull-up node and a pull-down node;
a third stage including an output terminal, a tenth PMOS transistor having a gate electrode connected to the pull-up node of the second stage, and a tenth NMOS transistor having a gate electrode connected to the pull-down node of the second stage, the third stage configured to perform a pull-up driving of the amplified voltage supplied from the second stage or a pull-down driving of the amplified voltage supplied from the second stage;
a first boosting circuit including an eleventh PMOS transistor having a gate electrode connected to the pull-up node included the second stage and the gate electrode of the tenth PMOS transistor included in the third stage, the first boosting circuit configured to increase a current in the first stage while the eleventh PMOS transistor is turned on; and
a second boosting circuit including an eleventh NMOS transistor having a gate electrode connected to the pull-down node included the second stage and the gate electrode of the tenth NMOS transistor included in the third stage, the second boosting circuit configured to increase the current in the first stage while the eleventh NMOS transistor is turned on.

2. The amplifier circuit according to claim 1, wherein the first stage further includes:
a first PMOS transistor including a gate electrode connected to a direct current (DC) voltage;
a first NMOS transistor including a gate electrode connected to the DC voltage;
a second PMOS transistor having a gate electrode connected to the first input terminal;
a second NMOS transistor having a gate electrode connected to the first input terminal;
a third PMOS transistor having a gate electrode connected to the second input terminal; and
a third NMOS transistor having a gate electrode connected to the second input terminal,
wherein the first input terminal of the first stage is connected to the output terminal of the third stage.

3. The amplifier circuit according to claim 2, wherein a drain electrode of the eleventh PMOS transistor is connected to a source electrode of the second PMOS transistor and a source electrode of the third PMOS transistor, and a drain electrode of the eleventh NMOS transistor is connected to a source electrode of the second NMOS transistor and a source electrode of the third NMOS transistor.

4. The amplifier circuit according to claim 3, wherein the second stage further includes:
a fourth PMOS transistor having a gate electrode connected to a PMOS feedback node;
a fifth PMOS transistor having a gate electrode connected to the PMOS feedback node;
a fourth NMOS transistor having a gate electrode connected to a NMOS feedback node; and
a fifth NMOS transistor having a gate electrode connected to the NMOS feedback node.

5. The amplifier circuit according to claim 4, wherein the first boosting circuit further includes a twelfth PMOS transistor having a gate electrode connected to the PMOS feedback node, and the second boosting circuit further includes a twelfth NMOS transistor having a gate electrode connected to the NMOS feedback node.

6. The amplifier circuit according to claim 5, wherein a drain electrode of the twelfth PMOS transistor is connected to the source electrode of the second PMOS transistor and the source electrode of the third PMOS transistor, and a drain electrode of the twelfth NMOS transistor is connected to the source electrode of the second NMOS transistor and the second electrode of the third NMOS transistor.

7. The amplifier circuit according to claim 5, wherein the first boosting circuit further includes a thirteenth PMOS transistor having a gate electrode connected to pull-up node and a fourteenth PMOS transistor having a gate electrode connected to the pull-up node, and the second boosting circuit further includes a thirteenth NMOS transistor having a gate electrode connected to the pull-down node and a fourteenth NMOS transistor having a gate electrode connected to the pull-down node.

8. The amplifier circuit according to claim 7, wherein a drain electrode of the thirteenth PMOS transistor is connected to a drain electrode of the third NMOS transistor, a drain electrode of the fourteenth PMOS transistor is connected to a drain electrode of the second NMOS transistor, a drain electrode of the thirteenth NMOS transistor is connected to a drain electrode of the second PMOS transistor, and a drain electrode of the fourteenth NMOS transistor is connected to a drain electrode of the third PMOS transistor.

9. The amplifier circuit according to claim 1, wherein the amplifier circuit is a unity gain buffer.

10. A display apparatus comprising:
a display panel including a plurality of pixels, a plurality of gate lines connected to the plurality of pixels, and a plurality of data lines connected to the plurality of pixels;
a gate driver configured to drive the plurality of gate lines of the display panel; and
a data driver configured to drive the plurality of data lines of the display panel, the data driver including an amplifier circuit that amplifies a data voltage, the amplifier circuit including:
a first stage including a first input terminal and a second input terminal, the first input terminal connected to an output terminal of the amplifier circuit that outputs the data voltage;
a second stage connected to the first stage and configured to amplify the data voltage, the second stage including a pull-up node and a pull-down node;
a third stage including the output terminal of the amplifier circuit that is connected to the first input terminal of the first stage, a pull-up PMOS transistor having a gate electrode connected to the pull-up node of the second stage, a pull-down NMOS transistor having a gate electrode connected to the pull-down node of the second stage, the third stage configured to perform a pull-up driving of the amplified data voltage supplied from the second stage while the pull-up PMOS transistor is turned on or a pull-down driving of the amplified data voltage supplied from the second stage while the pull-down NMOS transistor is turned on;

a first boosting circuit including a first boosting PMOS transistor having a gate electrode connected to the pull-up node included in the second stage and the gate electrode of the pull-up PMOS transistor included in the third stage, the first boosting circuit configured to increase a current in the first stage while the first boosting PMOS transistor is turned on; and a second boosting circuit including a first boosting NMOS transistor having a gate electrode connected to the pull-down node included the second stage and the gate electrode of the pull-down NMOS transistor included in the third stage, the second boosting circuit configured to increase the current in the first stage while the first boosting NMOS transistor is turned on.

11. The display apparatus according to claim 10, wherein the amplifier circuit is a unity gain buffer.

12. The display apparatus according to claim 10, wherein the first boosting circuit and the second boosting circuit are included in the first stage.

13. The display apparatus according to claim 10, wherein the first stage further includes:
a first PMOS transistor including a gate electrode connected to a direct current (DC) voltage;
a first NMOS transistor including a gate electrode connected to the DC voltage;
a second PMOS transistor having a gate electrode connected to the first input terminal;
a second NMOS transistor having a gate electrode connected to the first input terminal;
a third PMOS transistor having a gate electrode connected to the second input terminal; and
a third NMOS transistor having a gate electrode connected to the second input terminal.

14. The display apparatus according to claim 13, wherein a drain electrode of the first boosting PMOS transistor is connected to a source electrode of the second PMOS transistor and a source electrode of the third PMOS transistor, and a drain electrode of the first boosting NMOS transistor is connected to a source electrode of the second NMOS transistor and a source electrode of the third NMOS transistor.

15. The display apparatus according to claim 14, wherein the second stage further includes:
a fourth PMOS transistor having a gate electrode connected to a PMOS feedback node;
a fifth PMOS transistor having a gate electrode connected to the PMOS feedback node;
a fourth NMOS transistor having a gate electrode connected to a NMOS feedback node; and
a fifth NMOS transistor having a gate electrode connected to the NMOS feedback node.

16. The display apparatus according to claim 15, wherein the first boosting circuit further includes a second boosting PMOS transistor having a gate electrode connected to the PMOS feedback node, the gate electrode of the fourth PMOS transistor, and the gate electrode of the fifth PMOS transistor, and the second boosting circuit further includes a second boosting NMOS transistor having a gate electrode connected to the NMOS feedback node, the gate electrode of the fourth NMOS transistor, and the gate electrode of the fifth NMOS transistor.

17. The display apparatus according to claim 16, wherein the first boosting circuit and the second boosting circuit are included in the first stage.

18. The display apparatus according to claim 16, wherein a drain electrode of the second boosting PMOS transistor is connected to the source electrode of the second PMOS transistor and the source electrode of the third PMOS transistor, and a drain electrode of the second boosting NMOS transistor is connected to the source electrode of the second NMOS transistor and the second electrode of the third NMOS transistor.

19. The display apparatus according to claim 16, wherein the first boosting circuit further includes a third boosting PMOS transistor having a gate electrode connected to pull-up node and a fourth boosting PMOS transistor having a gate electrode connected to the pull-up node, and the second boosting circuit further includes a third boosting NMOS transistor having a gate electrode connected to the pull-down node and a fourth boosting NMOS transistor having a gate electrode connected to the pull-down node.

20. The display apparatus according to claim 19, wherein a drain electrode of the third boosting PMOS transistor is connected to a drain electrode of the third NMOS transistor, a drain electrode of the fourth boosting PMOS transistor is connected to a drain electrode of the second NMOS transistor, a drain electrode of the third boosting NMOS transistor is connected to a drain electrode of the second PMOS transistor, and a drain electrode of the fourth boosting NMOS transistor is connected to a drain electrode of the third PMOS transistor.

21. The display apparatus of claim 19, wherein the first boosting PMOS transistor, the second boosting PMOS transistor, the first boosting NMOS transistor, and the second boosting NMOS transistor are included in the first stage, and the third boosting PMOS transistor, the fourth boosting PMOS transistor, the third boosting NMOS transistor, and the third boosting NMOS transistor are included in the second stage.

* * * * *